(12) United States Patent
Li et al.

(10) Patent No.: US 11,011,644 B2
(45) Date of Patent: May 18, 2021

(54) THIN FILM TRANSISTOR, THIN FILM TRANSISTOR ARRAY, AND METHOD FOR DETECTING AN OBJECT TO BE DETECTED

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Guangyao Li, Beijing (CN); Lei Huang, Beijing (CN); Haitao Wang, Beijing (CN); Jun Wang, Beijing (CN); Qinghe Wang, Beijing (CN); Wei Li, Beijing (CN); Dongfang Wang, Beijing (CN); Liangchen Yan, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 149 days.

(21) Appl. No.: 16/506,216

(22) Filed: Jul. 9, 2019

(65) Prior Publication Data
US 2020/0152799 A1 May 14, 2020

(30) Foreign Application Priority Data
Nov. 13, 2018 (CN) .......................... 201811342219.4

(51) Int. Cl.
*H01L 27/12* (2006.01)
*H01L 29/786* (2006.01)
(Continued)

(52) U.S. Cl.
CPC ....... *H01L 29/78669* (2013.01); *G01N 27/00* (2013.01); *H01L 27/1218* (2013.01); *H01L 29/66765* (2013.01)

(58) Field of Classification Search
CPC ...................... H01L 29/78669; H01L 27/1218
(Continued)

(56) References Cited

U.S. PATENT DOCUMENTS

2013/0307029 A1 11/2013 Xu et al.
2016/0093491 A1 3/2016 Choi et al.
(Continued)

FOREIGN PATENT DOCUMENTS

| CN | 102242062 B | 12/2012 |
| CN | 104807869 A | 7/2015 |
| CN | 107845687 A | 3/2018 |

OTHER PUBLICATIONS

Park et al., "M-DNA/Transition Metal Dichalcogenide Hybrid Structure-based Bio-FET sensor with Ultra-high Sensitivity", Sci Rep 6, 35733 (2016), https://doi.org/10.1038/srep35733.

*Primary Examiner* — Elias Ullah
(74) *Attorney, Agent, or Firm* — The Webb Law Firm

(57) ABSTRACT

The present disclosure provides a thin film transistor, a thin film transistor array, and a method for detecting an object to be detected, wherein the thin film transistor is configured to detect a parameter of an object to be detected bound with a metal ion and includes an active layer, wherein: a carrier of the active layer without a metal element contained in the metal ion bound is of a first mobility, and a carrier of the active layer with the metal element bound is of a second mobility different from the first mobility.

19 Claims, 2 Drawing Sheets

(51) Int. Cl.
    *G01N 27/00* (2006.01)
    *H01L 29/66* (2006.01)
(58) Field of Classification Search
    USPC .......................................................... 257/374
    See application file for complete search history.

(56) References Cited

U.S. PATENT DOCUMENTS

2018/0158934 A1   6/2018   Jonker et al.
2019/0131410 A1   5/2019   Li et al.

THIN FILM TRANSISTOR, THIN FILM TRANSISTOR ARRAY, AND METHOD FOR DETECTING AN OBJECT TO BE DETECTED

CROSS-REFERENCE TO RELATED APPLICATIONS

The present disclosure claims priority to Chinese Patent Application 201811342219.4 filed on Nov. 13, 2018, the disclosure of which is incorporated by reference herein in its entirety.

TECHNICAL FIELD

The present disclosure relates to the field of detection, and especially to a thin film transistor, a thin film transistor array, and method for detecting an object to be detected.

BACKGROUND

In recent years, with the rapid development of Artificial Intelligence (AI), Internet of Things (IoT), and bio-detection technology, the detection based on thin film transistor has received more and more attention.

Thin film transistor is widely applied in fields such as intelligent bionic robot, human health, and wearable device.

SUMMARY

According to one aspect of embodiments of the present disclosure, a thin film transistor configured to detect a parameter of an object to be detected bound with a metal ion is provided, wherein the thin film transistor comprises an active layer, wherein: a carrier of the active layer without a metal element contained in the metal ion bound is of a first mobility, and a carrier of the active layer with the metal element bound is of a second mobility different from the first mobility.

In some embodiments, the thin film transistor comprises: a gate; a gate dielectric layer located on one side of the gate; and a source located on one side of the gate dielectric layer away from the gate; a drain located on the side of the gate dielectric layer away from the gate; and an insulating layer located on the side of the gate dielectric layer away from the gate, wherein: the active layer is located between the source and the drain, the insulating layer defines an opening, wherein the opening exposes at least a part of a surface on one side of the active layer away from the gate dielectric layer, and the insulating layer exposes at least a part of a surface on one side of the source away from the gate dielectric layer and at least a part of a surface on one side of the drain away from the gate dielectric layer.

In some embodiments, the object to be detected is chemically bound with the metal ion, and the active layer is physically bound with the metal element.

In some embodiments, a material of the active layer comprises at least one of molybdenum disulfide or tungsten disulfide.

In some embodiments, the active layer has a columnar shape.

In some embodiments, the object to be detected comprises a DNA.

In some embodiments, the parameter comprises a length.

In some embodiments, the second mobility is greater than the first mobility.

In some embodiments, thin film transistor further comprises a protective material in the opening.

In some embodiments, the protective material comprises a polyimide.

In some embodiments, a material of each of the source and the drain comprises a carbon nanotube.

In some embodiments, a material of the gate comprises a graphene.

In some embodiments, the metal ion comprises at least one of copper ion or iron ion.

According to another aspect of embodiments of the present disclosure, a thin film transistor array is provided. The thin film transistor array comprises a plurality of thin film transistors configured to detect a parameter of an object to be detected bound with a metal ion, wherein each of the plurality of thin film transistors comprises an active layer, wherein: a carrier of the active layer without a metal element contained in the metal ion bound is of a first mobility, and a carrier of the active layer with the metal element bound is of a second mobility different from the first mobility.

According to still another aspect of embodiments of the present disclosure, a method for detecting an object to be detected bound with a metal ion, comprising: measuring a conduction current between a source and a drain of each of a plurality of thin film transistors of a thin film transistor array, wherein a carrier of an active layer of each of the plurality of thin film transistors without a metal element contained in the metal ion bound is of a first mobility, and a carrier of the active layer with the metal element bound is of a second mobility different from the first mobility; determining at least one thin film transistor bound with the metal element from the plurality of thin film transistors according to the conduction current of each of the plurality of thin film transistors; and determining a parameter of the object to be detected according to a position of each of the at least one thin film transistor.

In some embodiments, the thin film transistor array and the object to be detected are located in a solution not containing the metal ion.

In some embodiments, determining the at least one thin film transistor comprises: dividing the plurality of thin film transistors into a first group of thin film transistors and a second group of thin film transistors according to the conduction current of each of the plurality of thin film transistors, wherein the conduction current of each of the first group of thin film transistors is greater than that of each of the second group of thin film transistors; and determining the first group of thin film transistors as the at least one thin film transistor.

In some embodiments, any two of the first group of thin film transistors have a same conduction current, and any two of the second group of thin film transistors have a same conduction current.

In some embodiments, determining the parameter of the object to be detected comprises: determining a position where the object to be detected is bound with the metal ion according to the position of each of the at least one thin film transistor; and determining the parameter of the object to be detected according to the position where the object to be detected is bound with the metal ion.

Other features, aspects and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be understood more clearly from the following detailed description with reference to the accompanying drawings, in which.

Figure 1:
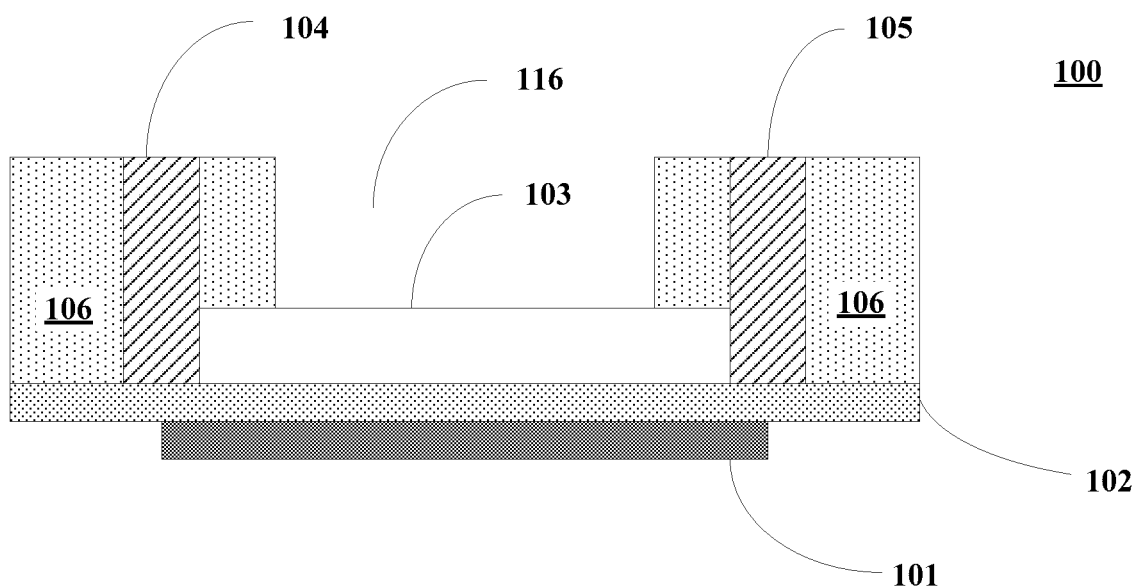
FIG. 1 is a schematic structural view showing a thin film transistor according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the biological field, it is necessary to tailor DNA and determine the change in DNA before and after tailoring in certain cases. However, in the related art, there is still no thin film transistor suitable for detecting the change in DNA.

The inventors have found that, a specific position of DNA (e.g., a specific position of a base sequence, such as a guanine (G)-cytosine (C) base pair) may be bound with copper ion to form a complex. If the position of DNA where the copper ion is bound can be detected, the general morphology of DNA may be identified, so that the lengths of DNA before and after being tailored may be accordingly obtained, and the change of DNA may be further determined.

Based on the above considerations, a thin film transistor configured to detect a parameter such as a length of an object to be detected bound with a metal ion is provided in embodiments of the present disclosure. The object to be detected may be, for example, a DNA. Here, the metal ion with which the object to be detected is bound may comprise at least one of copper ion or iron ion.

FIG. 1 is a schematic structural view showing a thin film transistor according to an embodiment of the present disclosure.

As shown in FIG. 1, the thin film transistor 100 comprises a gate 101, a gate dielectric layer 102 located on one side of the gate 101, an active layer 103 located on one side of the gate dielectric layer 102 away from the gate 101, a source 104 located on the side of the gate dielectric layer 102 away from the gate 101, a drain 105 located on the side of the gate dielectric layer 102 away from the gate 101, and an insulating layer 106 located on the side of the gate dielectric layer 102 away from the gate 101. The active layer 103 is located between the source 104 and the drain 105. In some embodiments, the active layer 103 may be in contact with the source 104 and the drain 105, respectively. It should be understood that the active layer 103 may also be referred to as a channel layer.

The insulating layer 106 defines an opening 116 that exposes at least a part of a surface on one side of the active layer 103 away from the gate dielectric layer 102. In some embodiments, the thin film transistor 100 further comprises a protective material, such as a polyimide (PI) material or the like, in the opening 116.

In addition, the insulating layer 106 also exposes at least a part of a surface on one side of the source 104 away from the gate dielectric layer 102 and at least a part of a surface on one side of the drain 105 away from the gate dielectric layer 102. In some implementations, the surface of the insulating layer 106 away from the gate dielectric layer 102, the surface of the source 104 away from the gate dielectric layer 102, and the surface of the drain 105 away from the gate dielectric layer 102 may be substantially flush, that is, flush within a deviation range of the process.

The material of the gate 101 may comprise, for example, a graphene or the like. The material of the gate dielectric layer 102 may comprise, for example, a high-k dielectric material such as aluminum oxide or hafnium oxide. The material of each of the source 104 and the drain 105 may comprise, for example, a carbon nanotube or the like. The material of the insulating layer 106 may comprise, for example, a silicon dioxide or the like.

Assume that a carrier of the active layer 103 not bound with a metal element contained in the metal ion with which the object to be detected is bound is of a first mobility, and a carrier of the active layer 103 bound with the metal element contained in the metal ion is of a second mobility. The second mobility is different from the first mobility. As an example, the metal ion with which the object to be detected is bound is copper ion, and the metal element contained in the metal ion is a copper element.

In some implementations, the second mobility is greater than the first mobility. It should be understood that, the embodiments of the present disclosure are not limited thereto, and in some implementations, the second mobility may also be smaller than the first mobility.

In the thin film transistor according to the above embodiments, the carrier mobility of the active layer without the metal element bound is different from that of the active layer with the metal element bound. Thus, by measuring conduction current between the source and the drain in a case where the thin film transistor is turned on, it is possible to determine whether the thin film transistor is bound with the metal element. Further, the position where the object to be detected is bound with the metal ion may be determined according to the position of the thin film transistor bound with the metal element.

The structure of the thin film transistor shown in FIG. 1 facilitates detecting a parameter of an object to be detected bound with a metal ion. For example, the position where the object to be detected is bound with the metal ion may be bound with a part of the surface of the active layer 103 exposed by the opening 116.

However, it should be understood that, the structure of the thin film transistor provided by embodiments of the present disclosure is not limited to the specific structure shown in FIG. 1. A thin film transistor may be configured to detect a parameter of an object to be detected bound with a metal ion, as long as the carrier mobility of the active layer without the metal element bound is different from that of the active layer with the metal element bound.

In some embodiments, the material of the active layer 103 comprises at least one of molybdenum disulfide or tungsten disulfide. In some embodiments, the active layer 103 may have a columnar shape. For example, the active layer 103 may be columnar molybdenum disulfide or tungsten disulfide. Such active layer 103 facilitates binding with a metal element, for example, the metal element may sink into the active layer 103.

In at least one embodiment, the object to be detected is chemically bound with a metal ion, while the active layer 103 is physically bound with the metal element contained in the metal ion. For example, the object to be detected is DNA, the active layer 103 is columnar molybdenum disulfide, and the metal ion is copper ion. In this case, DNA is chemically bound with the copper ion, and the columnar molybdenum disulfide is physically bound with the copper element. For example, a complex formed from chemically bound DNA and copper ion may be adsorbed on the columnar molybdenum disulfide, thus the copper element can be physically bound with the columnar molybdenum disulfide.

Figure 2:
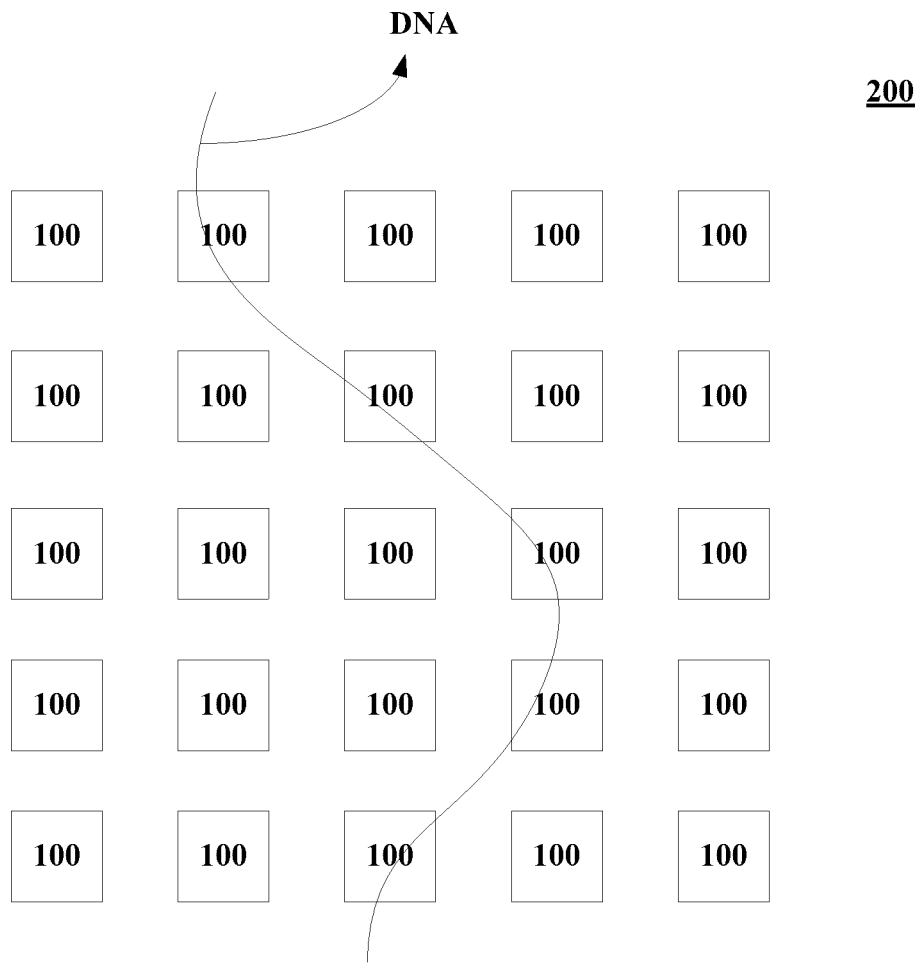
FIG. 2 is a schematic structural view showing a thin film transistor array according to an embodiment of the present disclosure.

FIG. 2 is a schematic structural view showing a thin film transistor array according to an embodiment of the present disclosure.

As shown in FIG. 2, the thin film transistor array 200 comprises a plurality of thin film transistors 100, each described as any one of the foregoing embodiments, arranged in an array manner. In addition, for the sake of illustration, the object to be detected is shown by taking DNA as an example in FIG. 2. For example, the position where DNA is bound with the metal ion may be bound with a part of the surface of the active layer 103 exposed by the opening 116 in the thin film transistor 100.

In some embodiments, the gates of the thin film transistors 100 of the same row or the same column may be connected to a same voltage line, through which a voltage may be applied to the gates of the thin film transistors 100 of the same row or the same column to control the thin film transistors 100 of the same row or the same column to turn on or turn off. In addition, in some embodiments, a switch may be provided between the gate of each thin film transistor 100 and the voltage line, such that each thin film transistor 100 may be controlled to turn on or turn off by controlling a corresponding switch turn on or turn off.

Figure 3:
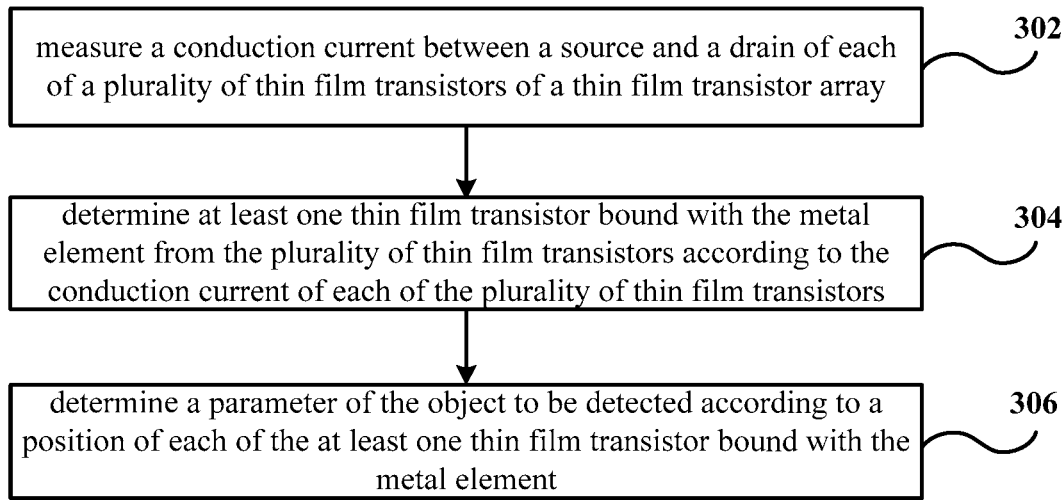
FIG. 3 is a schematic flow chart showing a method for detecting an object to be detected according to an embodiment of the present disclosure.

FIG. 3 is a schematic flow chart showing a method for detecting an object to be detected according to an embodiment of the present disclosure. Here, the object to be detected is bound with a metal ion such as a copper ion or an iron ion.

At step 302, a conduction current between a source and a drain of each of a plurality of thin film transistors of the thin film transistor array in FIG. 2 is tested.

In some embodiments, the thin film transistor array and the object to be detected may be located in a solution (e.g., a DNA culture solution) not containing the metal ion with which the object to be detected is bound. This may avoid the active layer of the thin film transistor bind with the metal ion in the solution, and improve the accuracy of the detection result.

For example, the object to be detected may be first placed in a solution containing a metal ion, and taken out of the solution after being bound with the metal ion. Thereafter, the thin film transistor array and the object to be detected may be placed in a solution not containing the metal ion with which the object to be detected is bound.

It should be noted that, when the object to be detected is detected with the thin film transistor array, if the thin film transistor (see FIG. 1) comprises a protective material in the opening 116, the protective material may be removed first to expose a part of the surface of the active layer 103. The protective material may be refilled in the opening 116 after the detection is completed.

At step 304, at least one thin film transistor of the plurality of thin film transistors bound with the metal element is determined according to the conduction current of each of the plurality of thin film transistors.

Since the carrier mobility of the active layer of the thin film transistor with the metal element bound is different from that of the active layer of the thin film transistor without the metal element bound, the conduction current of the thin film transistor with the metal element bound is also different from that of the thin film transistor without the metal element bound. Thus, it is possible to determine which thin film transistors are bound with the metal element according to the conduction current of each thin film transistor.

In some embodiments, all the thin film transistors in the thin film transistor array can be divided into a first group of thin film transistors and a second group of thin film transistors according to the conduction current of each of the thin film transistors. Here, the conduction current of each of the first group of thin film transistors is greater than that of each of the second group of thin film transistors. Thus, each of the first group of thin film transistors can be determined as a thin film transistor bound with the metal element.

For example, different thin film transistors in the first group of thin film transistors have a same conduction current, and different thin film transistors in the second group of thin film transistors have a same conduction current. In other words, any two of the first group of thin film transistors have the same conduction current, and any two of the second group of thin film transistors have the same conduction current.

Referring to FIG. 2, the thin film transistors (i.e., the thin film transistors 100 coinciding with the DNA strand) that are bound with DNA have substantially a same conduction current greater than that of the thin film transistors that are not bound with DNA.

At step 306, a parameter of the object to be detected is determined according to a position of each of the at least one thin film transistor bound with the metal element.

For example, a position where the object to be detected is bound with the metal ion may be determined according to the position of each thin film transistor that is bound with the metal element. Further, the parameter of the object to be detected may be determined according to the position where the object to be detected is bound with the metal ion.

It should be understood that, the position of each thin film transistor is related to the arrangement of the thin film transistor array. In a case where the arrangement of the thin film transistor array is determined, the position of each thin film transistor may be determined.

Referring to FIG. 2, the position of the thin film transistor bound with the metal element is a position (for example, at a GC base pair) where DNA is boned with the metal ion. The general morphology of DNA may be obtained by connecting together a plurality of positions that are determined, and the length of DNA can be determined.

According to the steps shown in FIG. 3, the lengths of DNA before and after being tailored may be obtained, and thus the change of DNA may be obtained.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A thin film transistor configured to detect a parameter of an object to be detected bound with a metal ion, wherein the thin film transistor comprises an active layer, wherein:
  a carrier of the active layer without a metal element contained in the metal ion bound is of a first mobility, and a carrier of the active layer with the metal element bound is of a second mobility different from the first mobility.

2. The thin film transistor according to claim 1, wherein the thin film transistor comprises:
  a gate;
  a gate dielectric layer located on one side of the gate;
  a source located on one side of the gate dielectric layer away from the gate;
  a drain located on the side of the gate dielectric layer away from the gate; and
  an insulating layer located on the side of the gate dielectric layer away from the gate, wherein:
  the active layer is located between the source and the drain,
  the insulating layer defines an opening, wherein the opening exposes at least a part of a surface on one side of the active layer away from the gate dielectric layer, and
  the insulating layer exposes at least a part of a surface on one side of the source away from the gate dielectric layer and at least a part of a surface on one side of the drain away from the gate dielectric layer.

3. The thin film transistor according to claim 1, wherein the object to be detected is configured to be chemically bound with the metal ion, and the active layer is configured to be physically bound with the metal element.

4. The thin film transistor according to claim 1, wherein a material of the active layer comprises at least one of molybdenum disulfide or tungsten disulfide.

5. The thin film transistor according to claim 4, wherein the active layer has a columnar shape.

6. The thin film transistor according to claim 1, wherein the object to be detected comprises a DNA.

7. The thin film transistor according to claim 6, wherein the parameter comprises a length.

8. The thin film transistor according to claim 6, wherein the second mobility is greater than the first mobility.

9. The thin film transistor according to claim 2, wherein the thin film transistor further comprises a protective material in the opening.

10. The thin film transistor according to claim 9, wherein the protective material comprises a polyimide.

11. The thin film transistor according to claim 2, wherein a material of each of the source and the drain comprises a carbon nanotube.

12. The thin film transistor according to claim 2, wherein a material of the gate comprises a graphene.

13. The thin film transistor according to claim 1, wherein the metal ion comprises at least one of copper ion or iron ion.

14. A thin film transistor array, comprising a plurality of thin film transistors configured to detect a parameter of an object to be detected bound with a metal ion, wherein each of the plurality of thin film transistors comprises an active layer, wherein:
  a carrier of the active layer without a metal element contained in the metal ion bound is of a first mobility, and a carrier of the active layer with the metal element bound is of a second mobility different from the first mobility.

15. A method for detecting an object to be detected bound with a metal ion, comprising:
  measuring a conduction current between a source and a drain of each of a plurality of thin film transistors of a thin film transistor array, wherein a carrier of an active layer of each of the plurality of thin film transistors without a metal element contained in the metal ion bound is of a first mobility, and a carrier of the active layer with the metal element bound is of a second mobility different from the first mobility;
  determining at least one thin film transistor bound with the metal element from the plurality of thin film transistors according to the conduction current of each of the plurality of thin film transistors; and determining a parameter of the object to be detected according to a position of each of the at least one thin film transistor.

16. The method according to claim 15, wherein the thin film transistor array and the object to be detected are located in a solution not containing the metal ion.

17. The method according to claim 15, wherein determining the at least one thin film transistor comprises:
   dividing the plurality of thin film transistors into a first group of thin film transistors and a second group of thin film transistors according to the conduction current of each of the plurality of thin film transistors, wherein the conduction current of each of the first group of thin film transistors is greater than that of each of the second group of thin film transistors; and
   determining the first group of thin film transistors as the at least one thin film transistor.

18. The method according to claim 17, wherein any two of the first group of thin film transistors have a same conduction current, and any two of the second group of thin film transistors have a same conduction current.

19. The method according to claim 15, wherein determining the parameter of the object to be detected comprises:
   determining a position where the object to be detected is bound with the metal ion according to the position of each of the at least one thin film transistor; and
   determining the parameter of the object to be detected according to the position where the object to be detected is bound with the metal ion.

* * * * *